(12) United States Patent
Prabhat

(10) Patent No.: US 8,456,939 B2
(45) Date of Patent: Jun. 4, 2013

(54) VOLTAGE REGULATION CIRCUITRY

(75) Inventor: Pranay Prabhat, Cambridge (GB)

(73) Assignee: ARM Limited, Cambridge (GB)

(*) Notice: Subject to any disclaimer, the term of this patent is extended or adjusted under 35 U.S.C. 154(b) by 260 days.

(21) Appl. No.: 12/926,499

(22) Filed: Nov. 22, 2010

(65) Prior Publication Data
US 2011/0141837 A1 Jun. 16, 2011

Related U.S. Application Data

(60) Provisional application No. 61/285,554, filed on Dec. 11, 2009.

(51) Int. Cl.
*G11C 5/14* (2006.01)
(52) U.S. Cl.
USPC .......................................... 365/226; 324/416
(58) Field of Classification Search
USPC .......................................... 365/226; 324/416
See application file for complete search history.

(56) References Cited

U.S. PATENT DOCUMENTS

2005/0156624 A1* 7/2005 Sommer ........................ 326/33
2009/0085651 A1* 4/2009 Liu et al. ...................... 327/539

\* cited by examiner

*Primary Examiner* — Hoai V Ho
(74) *Attorney, Agent, or Firm* — Nixon & Vanderhye P.C.

(57) ABSTRACT

Voltage regulation circuitry is provided comprising a pull-up p-type threshold device connecting a supply voltage node to an output voltage node, the pull-up p-type threshold device configured to be switched off in dependence on a control signal. A pull-down stack connects the output voltage node to a reference voltage node, the pull-down stack comprising a pull-down p-type threshold device and a pull-down n-type threshold device connected in series. An inverter is configured to receive an input from the output voltage node and is configured to generate a cut-off signal, wherein the pull-down n-type threshold device is configured to be switched on in dependence on the control signal and the pull-down p-type threshold device is configured to be switched off in dependence on the cut-off signal.

19 Claims, 8 Drawing Sheets

VOLTAGE REGULATION CIRCUITRY

This application claims priority to U.S. Provisional Application No. 61/285,554, filed Dec. 11, 2009, the entire contents of which are hereby incorporated by reference.

BACKGROUND OF THE INVENTION

1. Field of the Invention

The present invention relates to voltage regulation circuitry. More particularly, this invention relates to providing an output voltage in dependence on a supply voltage using pull-up and pull-down threshold devices connected between the supply voltage and a reference voltage, the threshold devices being switched in dependence on a control signal.

2. Description of the Prior Art

It is known to provide voltage regulation circuitry connected between a supply voltage node and a reference voltage node to generate an output voltage and an intermediate output voltage node, wherein threshold devices of the voltage regulation circuitry are switched in dependence on a control signal. This enables the output voltage level to be controlled in dependence on the control signal. One environment in which such a voltage regulation circuit may be used is in the context of providing a supply voltage for the bitcells of a memory array. An example known bitcell is schematically illustrated in FIG. 1A. The bitcell 10 comprises reverse coupled inverters 12 and 14, which enable a logical value to be held at each of the bitcell nodes 16 and 18. In the illustrated example a logical value "1" is held at bitcell node 16, whilst a logical value "0" is held at bitcell node 18. Each of the bitcell inverters 12 and 14 is powered by bitcell supply voltage VDDCE and connected to the reference voltage VSSE. The bitcell 10 is connected to the bitlines BL and NBL via pass gates 20 and 22, each controlled by a wordline signal WL.

A problem which can arise in such bitcells (which may for example be SRAM cells) in advanced processed technologies is that it can become difficult to write a logical "0" at a bitcell node which is holding a previously stored logical value "1", when the bitcell is operating at the low operational voltages which are desired in contemporary integrated circuits. The occurrence of this problem is further illustrated with reference to FIG. 1B, which schematically illustrates a bitcell node 16 holding a logical value "1". In order for this value to be rewritten as a logical value "0" the wordline generation circuitry 30 asserts the wordline signal WL controlling the pass gate 20, in order to discharge bitcell node 16 via bitline BL. However, when the pass gate 20 is relatively weak, it can be difficult for the pass gate 20 to overcome the pull-up device 24 within the bitcell.

A known solution to this problem is to temporarily lower the bitcell supply voltage VDDCE during the write process in order to make the bitcell pull-up device 24 weaker and easier to overcome. Given that such memory arrays typically make use of various self-timing signals for their operation, the usual approach is to generate a self-timed pulse for the pull-down of the bitcell supply voltage VDDCE. However, extra control circuitry must be provided in order to generate this self-timed pulse which may be skewed with respect to the main self-timed path in the memory array. Furthermore, when pulling down the bitcell supply voltage, it must be ensured that the bitcell supply voltage is not allowed to fall too low, since otherwise the bitcell contents (in particular, the contents of other bitcells sharing this bitcell supply voltage) may be corrupted. In addition there is a power and cycle time overhead associated with the bitcell supply voltage falling lower than necessary. Moreover, variability in the rate of fall of the bitcell supply voltage (due to process, temperature variation etc) means that, when generating a self-timed pulse for the pull-down, extra margin needs to be left to ensure reliable operation despite these variations. These factors make it difficult to provide a single circuit which will work across the whole range of expected process, temperature, pulse width and bitcell column size variation.

Hence it would be desirable to provide an improved technique for providing such voltage regulation circuitry.

SUMMARY OF THE INVENTION

Viewed from a first aspect, the present invention provides voltage regulation circuitry comprising a pull-up p-type threshold device connecting a supply voltage node to an output voltage node, said pull-up p-type threshold device configured to be switched off in dependence on a control signal; a pull-down stack connecting said output voltage node to a reference voltage node, said pull-down stack comprising a pull-down p-type threshold device and a pull-down n-type threshold device connected in series; and an inverter configured to receive an input from said output voltage node and configured to generate a cut-off signal, wherein said pull-down n-type threshold device is configured to be switched on in dependence on said control signal and said pull-down p-type threshold device is configured to be switched off in dependence on said cut-off signal.

Accordingly, voltage regulation circuitry is provided in which an output voltage node is connected to a supply voltage node via a pull-up p-type threshold device, which is switched off in dependence on a control signal, in other words, when the control signal is not asserted, the pull-up p-type threshold device is switched on and causes the output voltage node to be pulled-up to the voltage provided by the supply voltage node. The output voltage node is also connected to a reference voltage node via a pull-down stack comprising a pull-down p-type threshold device and a pull-down n-type threshold device connected in series. The pull-down n-type threshold device is also switched in dependence on the control signal, being configured to be switched on in dependence on the control signal. Hence, when the control signal is asserted, the pull-down n-type threshold device is switched on and the pull-up p-type threshold device is switched off, causing the voltage at the output voltage node to be drawn down towards the voltage of the reference voltage node.

However, the pull-down stack also comprises a pull-down p-type threshold device which is configured to be switched off in dependence on a cut-off signal, the cut-off signal being generated by an inverter which receives as its input the voltage from the output voltage node. Hence, when the control signal is asserted, and the output voltage node begins to fall, the inverter generates a cut-off signal which rises correspondingly. Eventually the rising cut-off signal causes the pull-down p-type threshold device in the pull-down stack to be switched off, isolating the output voltage node from the reference voltage node and preventing a further fall in the voltage provided at the output voltage node.

It is of particular benefit that the switching of the pull-down p-type threshold device in the pull-down stack depends on the voltage at the output voltage node, rather than for example on the timing of a control signal, since this means that the voltage regulation circuitry is not sensitive to factors such as process and temperature variation in the manner that a self-timed circuit would be. Furthermore, using a p-type threshold device in the pull-down stack enables a fast feedback signal from the output voltage node to be provided, avoiding the need for an additional inversion stage which would be required if an n-type threshold device (as might normally be expected to be used in such a pull-down stack) were to be used for this feedback switched device. In addition, the inclusion of a p-type threshold device in the pull-down stack means that the rate of fall of the output voltage will reduce as it approaches the threshold voltage of the p-type threshold device. The slowdown facilitates control of the feedback loop. However it should also be noted that the use of a p-type threshold device as the cut-off device also enables this device to be switched off more quickly, since its source voltage (i.e. the voltage at the output voltage node) is falling whilst its gate voltage (i.e. the cut-off signal) is simultaneously rising. As such $V_{sg}$ for this device decreases faster than would be the case for an n-type threshold device (having its source fixed to ground).

The inverter may be provided in a number of ways, but in one embodiment said inverter comprises a further p-type threshold device and a further n-type threshold device connected in series between said supply voltage node and said reference voltage node, said further p-type threshold device connecting said supply voltage node to a cut-off node and said further n-type threshold device connecting said cut-off node to said reference voltage node, wherein said further p-type threshold device is configured to be switched on when said input from said output voltage node is below a threshold voltage, said further n-type threshold device is configured to be switched on in dependence on an inverted version of said control signal, and said cut-off signal is provided at said cut-off node.

Accordingly, the inverter is essentially provided by the further p-type threshold device which is switched off when the input from the output voltage node is high (above the threshold voltage) and is switched on when the input from the output voltage node is lower (below the threshold voltage). At the same time, the further n-type threshold device connects the cut-off node to the reference voltage node in dependence on an inverted version of the control signal, meaning that when the control signal is not asserted (and the inverted version is thus asserted), the voltage at the cut-off node is pulled down to the reference voltage. Conversely, when the control signal is asserted, (and the inverted version of the control signal is thus not asserted), the further n-type threshold device is switched off and allows the voltage at the cut-off node to be controlled by the further p-type threshold device. Hence a dynamic inverter is provided which avoids static current leakage by isolating the cut-off node from the reference voltage node when the control signal is switched off.

The voltage regulation circuitry may be implemented in a number of contexts, but advantageously said output voltage node provides a bitcell supply voltage for at least one memory bitcell. This is due to the fact that whilst it is useful for the bitcell supply voltage for a memory bitcell to be reduced (for example during a write procedure) it is necessary that the bitcell supply voltage is not allowed to fall too low since this would risk the corruption of bitcell contents. The voltage regulation circuitry provided is of further benefit in the context of a bitcell supply voltage for at least one memory bitcell since the voltage regulation circuitry is not sensitive to process, temperature, pulse width and bitcell column size variation in the manner that an arrangement dependent on a self-timed pulse for pulling-down the output voltage would be.

In the context of providing a bitcell supply voltage for at least one memory bitcell the temporary pulling-down of the output voltage provided by the voltage regulation circuitry may be useful in a number of ways, in particular in one embodiment said control signal is configured to be asserted during a write procedure of said at least one memory bitcell. For example, during a write procedure of a memory bitcell a temporary reduction in the bitcell supply voltage can assist the write procedure by temporarily weakening a pull-up device connected to the bitcell supply voltage in the bitcell, thus making it easier to overcome and "overwrite" the value held in association with that pull-up device.

In one such embodiment the voltage regulation circuitry further comprises control signal generation circuitry configured to generate said control signal in dependence on write procedure control signals, wherein said control signal generation circuitry is configured to assert said control signal in response to a power gating signal, regardless of said write procedure control signals. Accordingly, the power gating signal ensures that the pull-up p-type threshold device is switched off and the pull-down n-type threshold device is switched on, holding the output voltage node at a low value thus reducing bitcell leakage. Whilst some power will be consumed by enabling the path from the output voltage node to the reference voltage node in the voltage regulation circuitry in this manner, if the memory bitcells are intended to be inactive for a relatively long period of time, then this trade-off will be worth it. Conversely if the memory bitcells need only be inactive for a relatively short period of time, this trade-off may be less worthwhile.

In one such embodiment, said output voltage node provides said bitcell supply voltage for a plurality of memory bitcells and said write procedure control signals comprise multiplexer signals configured to select between said plurality of memory bitcells and write mask control signals. Accordingly, the bitcell supply voltage may be provided for a number of memory bitcells (for example provided in a modular fashion within a larger memory array) and multiplexer signals may be provided to select between the memory bitcells (for example selecting one group of memory bitcells within a module). The power gating signal enables these write procedure control signals to be overridden and thus reduce bitcell leakage.

In one embodiment said at least one memory bitcell is at least one SRAM memory bitcell. For example, an SRAM memory bitcell may benefit from a "write-assist" reduction in the bitcell supply voltage as described above. It will be understood that whilst an SRAM bitcell is usually a 6 transistor single port bitcell the techniques of the present invention are not limited thereto and are applicable to all single and dual ported bitcells having other numbers of transistors.

In one embodiment said output voltage node provides a bitcell supply voltage for a column of memory cells. The voltage regulation circuitry may be of particular benefit in the context of providing a bitcell supply voltage for a column of memory bitcells, since when one memory bitcell in a column is being written to, it is necessary for the other memory bitcells in the column to retain their contents unaffected by the write procedure going on in the selected bitcell. Reliably preventing the bitcell supply voltage from falling too low ensures that the contents of the other bitcells are protected.

In one embodiment a switching threshold of said inverter is configured such that, after said control signal is asserted, said cut-off signal causes said pull-down p-type threshold device to be switched off before said control signal is deasserted. Hence, during the period between the control signal being asserted and then deasserted, the switching threshold of the inverter is already reached, so that the resulting cut-off signal causes the pull-down p-type threshold device to be switched off and thus prevent a further fall in the output voltage. Hence, the voltage regulation circuitry may be configured so that the fall of the output voltage is limited during the period in which the control signal is asserted.

When the inverter is provided by a further p-type threshold device and a further n-type threshold device, this limitation of the fall of the output voltage during the period in which the control signal is asserted may be provided by a switching threshold of said further p-type threshold device being configured such that, after said control signal is asserted, said cut-off signal causes said pull-down p-type threshold device to be switched off before said control signal is deasserted.

In one embodiment a switching threshold of said inverter is configured such that said cut-off signal causes said pull-down p-type threshold device to be switched off when a threshold voltage of said input from said output voltage node is reached. Accordingly, the inverter can be arranged such that the voltage at the output voltage node is prevented from falling below that threshold voltage. It will be recognised that whilst this threshold voltage might be predefined for a particular well understood circuit operating under known conditions, in general the switching threshold of the inverter will depend on factors such as the supply voltage, the ambient temperature and so on and may therefore not be predefined by the system designer.

In embodiments in which the inverter is provided by a further p-type threshold device and a further n-type threshold device, a switching threshold of said further p-type threshold device may be configured such that said cut-off signal causes said pull-down p-type threshold device to be switched off when said threshold voltage of said input from said output voltage node is reached. As noted above it will be recognised that whilst this threshold voltage might be predefined for a particular well understood circuit operating under known conditions, in general the switching threshold of the further p-type threshold device will depend on factors such as the supply voltage, the ambient temperature and so on and may therefore not be predefined by the system designer.

It will be appreciated that the p-type and n-type threshold devices could be provided using a number of technologies, but in one embodiment said pull-up p-type threshold device and said pull-down p-type threshold device are PMOS threshold devices and said pull down n-type threshold device is an NMOS threshold device. Similarly, in one embodiment said further p-type threshold device is a PMOS threshold device and said further n-type threshold device is an NMOS threshold device.

In one embodiment said pull-up p-type threshold device is larger than said pull down n-type threshold device and said pull-down p-type threshold device. Whilst the pull-down n-type threshold device and pull-down p-type threshold device can advantageously be configured at a minimum size of the provided process (i.e. in a given integrated circuit at a given process scale being sized at the lower limit of that process scale), it is advantageous if the pull-up p-type threshold device is larger (for example by an order of magnitude), since this enables the output voltage to be quickly pulled-up towards the supply voltage when the control signal is deasserted.

Viewed from a second aspect the present invention provides a memory device comprising voltage regulation circuitry according to the first aspect.

Viewed from a third aspect the present invention provides voltage regulation circuitry comprising: pull-up p-type threshold means for connecting a supply voltage node to an output voltage node, said pull-up p-type threshold means configured to be switched off in dependence on a control signal; pull-down stack means for connecting said output voltage node to a reference voltage node, said pull-down stack means comprising a pull down n-type threshold device and a pull-down p-type threshold device connected in series; and inverting means for receiving an input from said output voltage node and generating a cut-off signal, wherein said pull-down n-type threshold device is configured to be switched on in dependence on said control signal and said pull-down p-type threshold device is configured to be switched off in dependence on said cut-off signal.

Whilst the above aspects and embodiments of the invention have been described with reference to providing a cut-off for a falling output voltage, it should be noted that the techniques of the present invention are equally applicable in a complementary arrangement, i.e. one in which a cut-off for a rising output voltage is provided. Accordingly, viewed from a fourth aspect the present invention provides voltage regulation circuitry comprising: a pull-down n-type threshold device connecting a reference voltage node to an output voltage node, said pull-down n-type threshold device configured to be switched in dependence on a control signal; a pull-up stack connecting said output voltage node to a supply voltage node, said pull-up stack comprising a pull-up p-type threshold device and a pull-up n-type threshold device connected in series; and an inverter configured to receive an input from said output voltage node and configured to generate a cut-off signal, wherein said pull-up p-type threshold device is configured to be switched in dependence on said control signal and said pull-up n-type threshold device is configured to be switched in dependence on said cut-off signal.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1A:
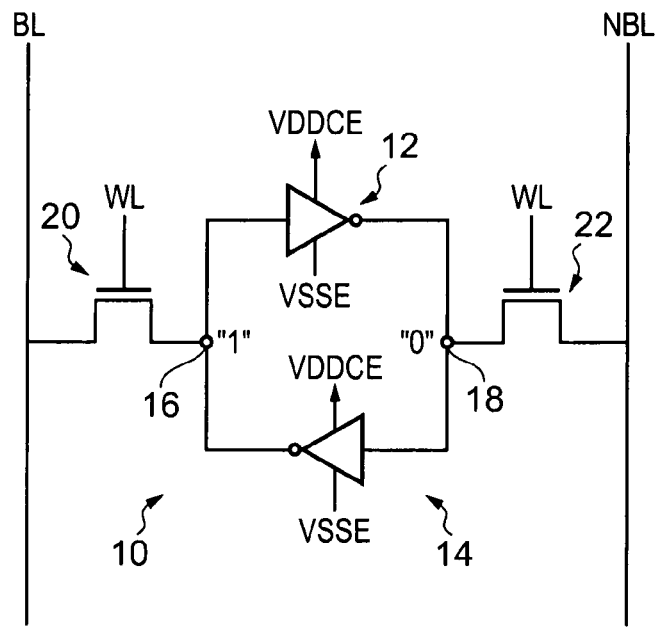
FIG. 1A schematically illustrates a known memory bitcell and FIG. 1B schematically illustrates the sub-components of that known memory bitcell involved in writing a logical "0" to a bitcell node holding a logical "1"
Figure 1B:
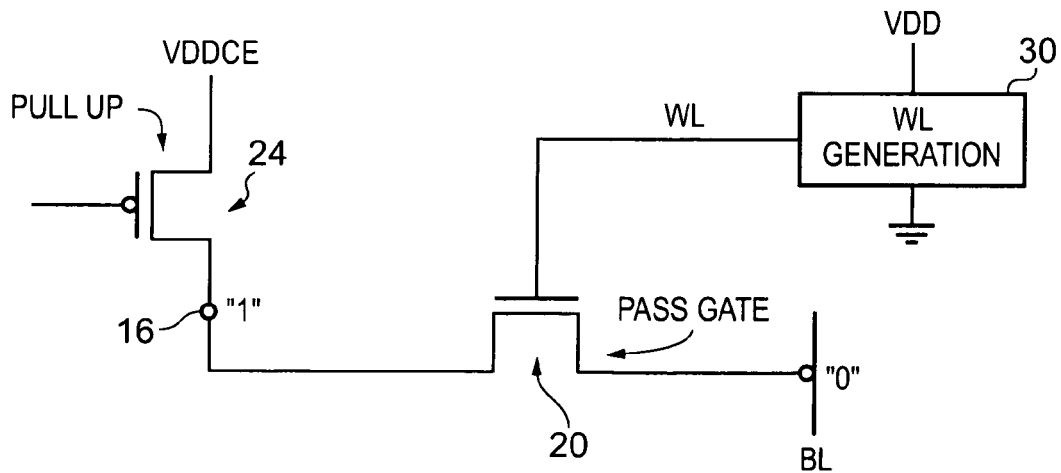
Figure 2:
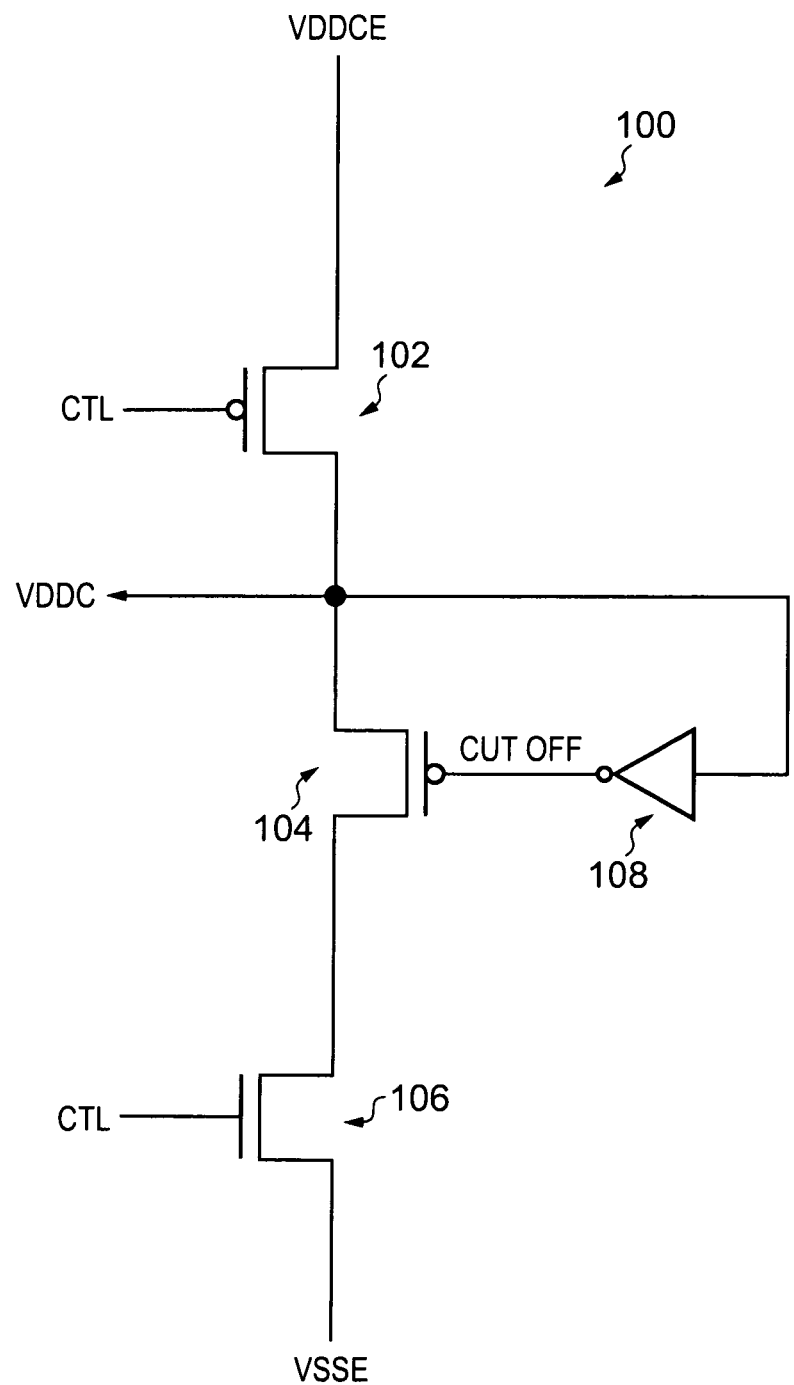
FIG. 2 schematically illustrates a voltage regulation circuit according to one embodiment.

FIG. 2 schematically illustrates a voltage regulation circuit according to one embodiment. The voltage regulation circuit 100 comprises two p-type threshold devices 102, 104 and one n-type threshold device 106 connected in series between a supply voltage node (VDDCE) and a reference voltage node (VSSE). Pull-up p-type threshold device 102 is a PMOS transistor controlled by the control signal CTL and connects (in dependence on control signal CTL) the supply voltage node VDDCE to an output voltage node (VDDC). Pull-down p-type threshold device 104 and pull-down n-type threshold device 106 form a pull-down stack connecting the output voltage node VDDCE to the reference voltage node VSSE. Pull-down p-type threshold device 104 is a PMOS transistor controlled in dependence of the cut-off signal (CUTOFF) and the pull-down n-type threshold device 106 is an NMOS transistor also controlled by the control signal CTL. An inverter 108 receives its input from the output voltage node (VDDC) and generates the cut-off signal CUTOFF which controls pull-down PMOS 104.

In a set up phase the control signal CTL is not asserted, such that NMOS 106 is switched off and PMOS 102 is switched on. Hence, PMOS 102 connects the output node to the supply node, and VDDC is pulled-up to VDDCE. Further the high value of VDDC at the input of inverter 108 results in a low value of the CUTOFF signal switching on PMOS 104, but the path between VDDC and VSSE is of course blocked by the switched-off NMOS 106.

In operation, the control signal CTL is asserted, turning off PMOS 102 and turning on NMOS 106. Hence, VDDC falls, being pulled down towards VSSE. This falling value of VDDC at the input of inverter 108 then at some point passes a switching threshold of the inverter 108, and the signal CUTOFF is asserted. The assertion of the cut-off signal switches off PMOS 104, preventing further fall of VDDC towards VSSE. The use of a p-type threshold device as the cut-off device (PMOS 104) means that this device can be switched off quickly (more quickly than a corresponding NMOS device at this position), since its source voltage (i.e. the voltage at the output voltage node) is falling whilst its gate voltage (i.e. the cut-off signal) is simultaneously rising. As such $V_{sg}$ for this p-type device decreases faster than would be the case for an n-type threshold device (having its source fixed to ground). The switching threshold of inverter 108 is most usefully configured such that during the period in which the control signal CTL is to be asserted, the cut-off signal CUTOFF will cause PMOS 104 to be switched off before the control signal CTL is deasserted.

Figure 3:
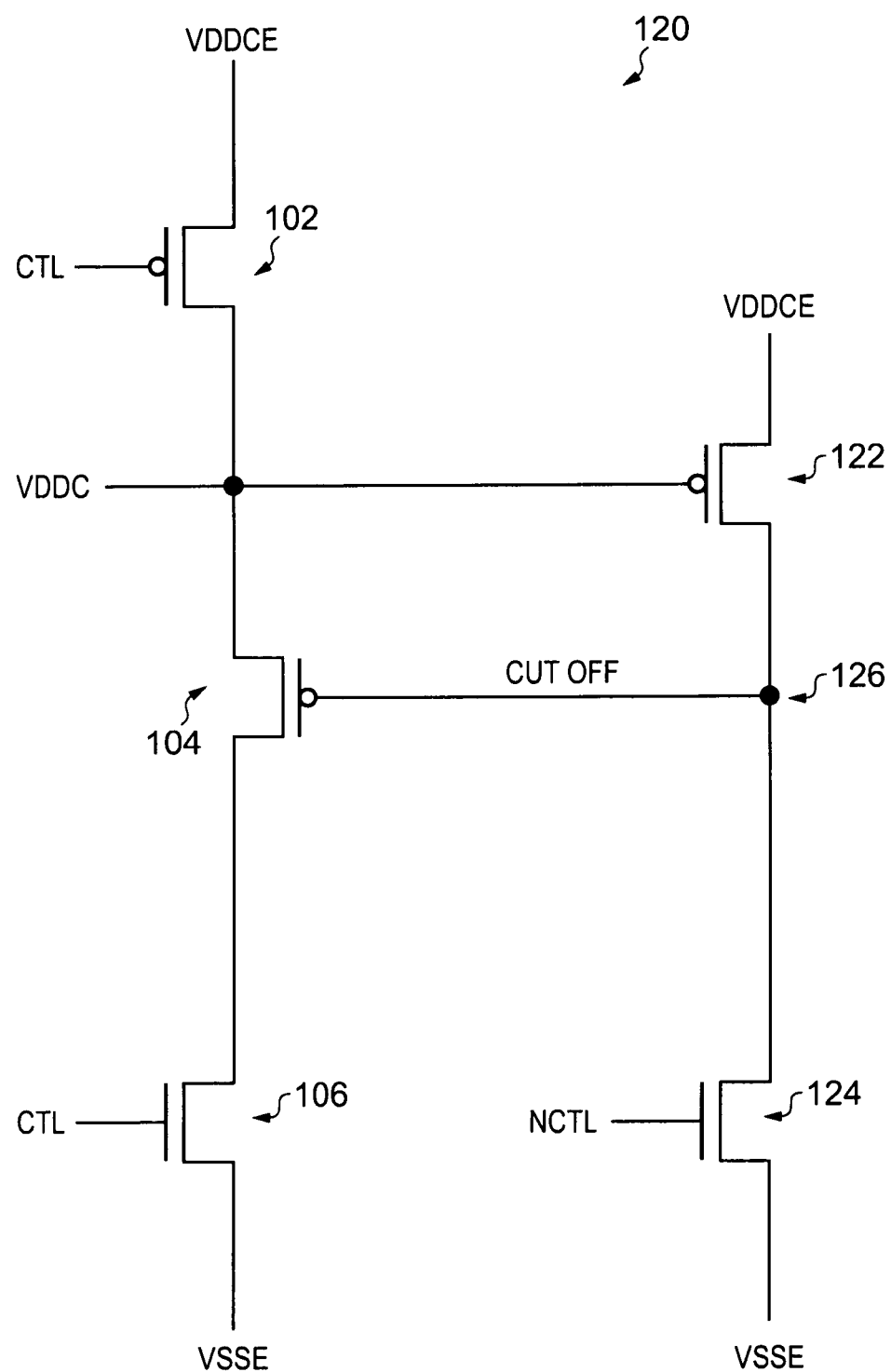
FIG. 3 schematically illustrates a voltage regulation circuit according to one embodiment.

FIG. 3 schematically illustrates voltage regulation circuitry 120 in one embodiment, in which the output voltage node VDDC provides the bitcell supply voltage for memory bitcells in a memory array. As can be seen in FIG. 3, the PMOS transistors 102, 104 and the NMOS transistor 106 are connected in the same fashion between supply voltage node VDDCE and reference voltage node VSSE as was described with reference to FIG. 2. However, in the embodiment schematically illustrated in FIG. 3, the static inverter 108 has been replaced by a dynamic inverter comprising PMOS transistor 122 and NMOS transistor 124. PMOS transistor 122 is switched in dependence on the voltage at the output voltage node, whilst NMOS transistor 124 is switched in dependence on an inverted version of the control signal CTL, namely NCTL.

Similarly to the embodiment described with reference to FIG. 2, in the embodiment schematically illustrated in FIG. 3 in a set up phase the control signal is deasserted (CTL=0) and hence the inverted version thereof is asserted (i.e. NCTL=1). Hence, NMOS 124 is switched on and the voltage at cut-off node 126 is discharged via NMOS 124. The low value of the cut-off signal switches on PMOS 104, but the path to VSSE is of course blocked by virtue of the fact that CTL=0 has turned off NMOS 106. Meanwhile, the low value of CTL switches on PMOS 102 and VDDC at the output node is pulled-up to VDDCE at the supply node.

During a write procedure of one of the memory bitcells for which the voltage regulation circuit 120 provides the output voltage VDDC as the bitcell supply voltage, the corresponding write procedure control signals (described in more detail below with reference to FIGS. 4A, 4B, 5A and 5B) cause the control signal CTL to be asserted and its inverted version NCTL to be deasserted. Hence, PMOS 102 is switched off and NMOS 106 is switched on, causing VDDC to start discharging through PMOS 104 and NMOS 106. At the same time, the deassertion of NCTL switches off NMOS 124, releasing CUTOFF and allowing it to float. Since CUTOFF was previously held low, for the time being PMOS 104 remains switched on. Then as VDDC falls, PMOS 122 begins to turn on and to pull-up the voltage at cut-off node 126 towards VDDCE. As VDDC falls and CUTOFF rises, PMOS 104 starts to turn off and the pull-down of VDDC slows down. Eventually, PMOS 104 turns off, the fall of the VDDC is stopped and VDDC is left floating, CUTOFF having been pulled high. In this way, the bitcell supply voltage VDDC is pulled-down in response to the assertion of the control signal CTL, but the pull-down is automatically cut-off after a certain level. When this cut-off occurs can be determined by the choice of switching threshold of PMOS 122. The relative timing of the various signals in FIG. 3 is discussed below with reference to FIGS. 5A and 5B. Finally, once CTL is deasserted, VDDC is pulled-up to VDDCE again through PMOS 102 (whilst at the same time the path to VSSE through NMOS 106 is disabled by NMOS 106 being switched off). In order to enable this pull-up of VDDC to happen quickly, PMOS 102 is typically sized to be larger than the other PMOS/NMOS devices in the voltage regulation circuit. For example in the illustrated embodiment PMOS 102 is sized as 1 μm, whilst PMOS devices 104 and 122, and NMOS devices 106 and 124 are sized as 0.104 μm. The deassertion of CTL corresponds to the assertion of NCTL, which switches on NMOS 124, discharging the cut-off node 126 to VSSE.

Figure 4A:
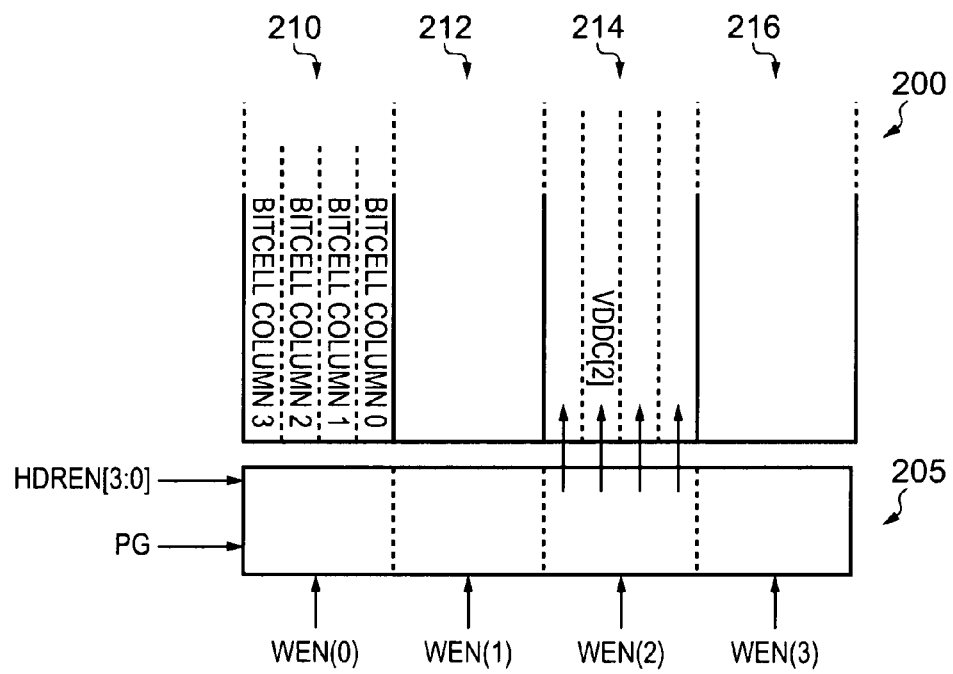
FIG. 4A schematically illustrates an array of memory bitcells arranged in modular columns and associated access control circuitry in one embodiment.
Figure 4B:
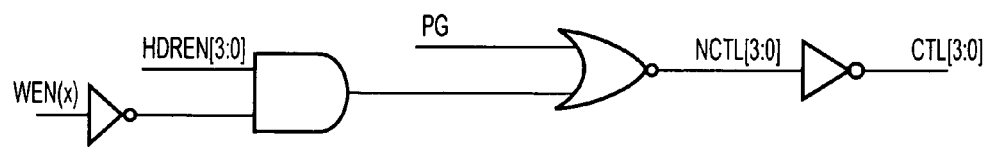
FIG. 4B schematically illustrates the generation of the control signals and inverted control signals for an array of memory bitcells such as that shown in FIG. 4A.

The context of the voltage regulation circuit 120 schematically illustrated in FIG. 3 providing a bitcell supply voltage for the memory bitcells of a memory array is further illustrated with reference to FIGS. 4A and 4B. FIG. 4A schematically illustrates a memory array 200 and its associated control circuitry 205. The memory array 200 comprises four modules of bitcells 210, 212, 214 and 216. Each module comprises four columns of bitcells (see bitcell columns 0-3 illustratively shown in module 210). During a write procedure for the memory array 200, the write mask control signals WEN(0-3) provide a selection mechanism between the modules 210, 212, 214 and 216, whilst the multiplexer HDREN signals select between the bitcell columns in a given module. A power gating signal PG is also provided which enables the write procedure control signals to be overridden and thus to hold the memory bit cells of the memory array 200 in a low power state. The memory control circuitry 205 generates the control signal CTL (and its inverted version NCTL) to provide the bitcell supply voltage VDDC appropriately for each bitcell column. Hence the voltage regulation circuitry is to be found within the control circuitry 205, repeated for each of the separate VDDC bitcell supplies that are required. In the figure, VDDC[2] is illustratively shown being provided to module 214 (providing the bitcell supply for bitcell column 2 within that module).

The generation of the control signals CTL and NCTL in the memory control circuitry 205 is illustrated with reference to FIG. 4B. Note that each of CTL and NCTL are provided as four bit values, each controlling one of the bitcell columns in each module. For a memory bitcell in a given bitcell column to be written to, the corresponding multiplexer signal HDREN must be asserted for that column together with the write mask control signal WEN for that module. Of course the power gating signal PG must also not be asserted. The combination of HDREN and WEN corresponding to a particular bitcell column and module deasserts the corresponding NCTL signal and asserts the corresponding CTL signal. Note however that the power gating signal has the ability to override WEN and HDREN, forcing NCTL to be deasserted and CTL to be asserted.

Figure 5A:
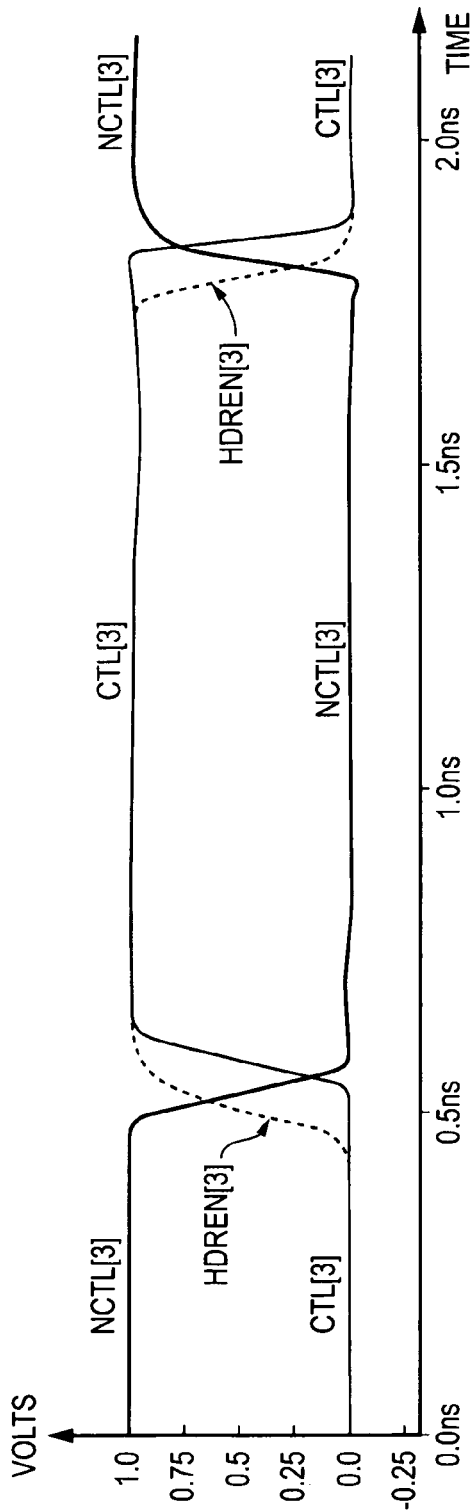
FIGS. 5A and 5B schematically illustrate the time variation of various signals in a voltage regulation circuit according to one embodiment.
Figure 5B:
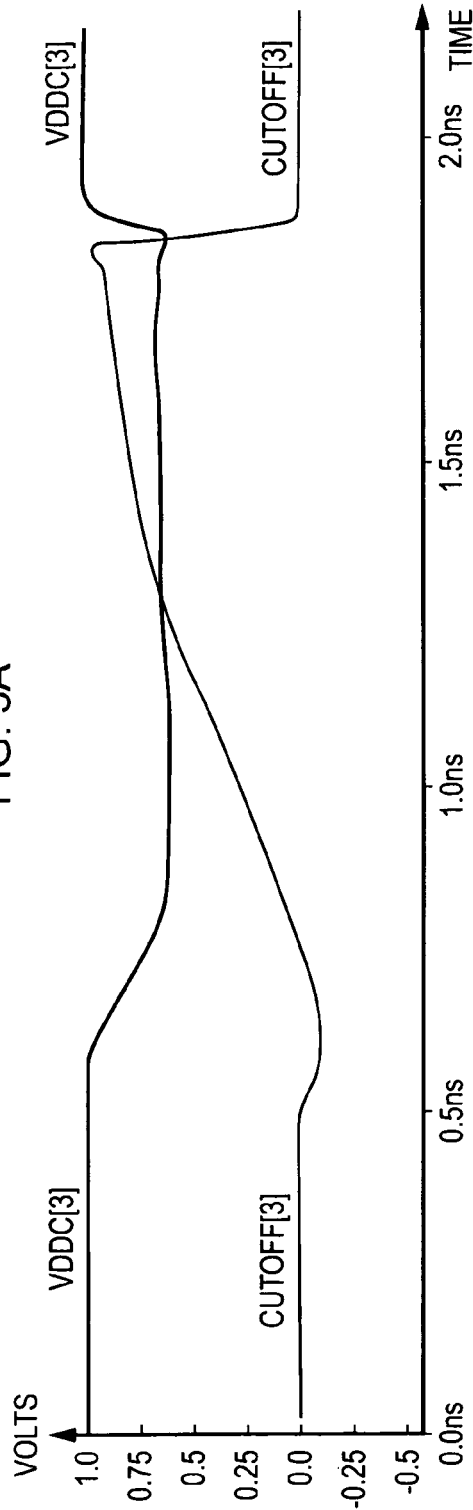

The relative timing of the signals in a voltage regulation circuit such as that illustrated in FIG. 3 are given in FIGS. 5A and 5B. FIGS. 5A and 5B represent the same timescale, the division of the signals between FIGS. 5A and 5B being for clarity of illustration only. The example signals given in FIGS. 5A and 5B correspond to a fourth bitcell column (bitcell column 3) such as that in a modular embodiment described with reference to FIGS. 4A and 4B. In FIG. 5A it can be seen that the assertion of HDREN[3] causes NCTL[3] to be deasserted and CTL[3] to be asserted. The corresponding bitcell supply voltage VDDC[3] then begins to fall, whilst the cut-off signal CUTOFF[3] begins to rise. Eventually the rising value of CUTOFF[3] switches off the pull-down PMOS transistor (e.g. PMOS 104 in FIG. 3) preventing VDDC[3] from falling further. At the end of the write procedure HDREN[3] is deasserted, causing NCTL[3] to be reasserted and CTL[3] to be deasserted. Consequently, VDDC[3] is rapidly pulled-up again, whilst CUTOFF[3] is pulled back down to the value of VSSE.

Figure 6:
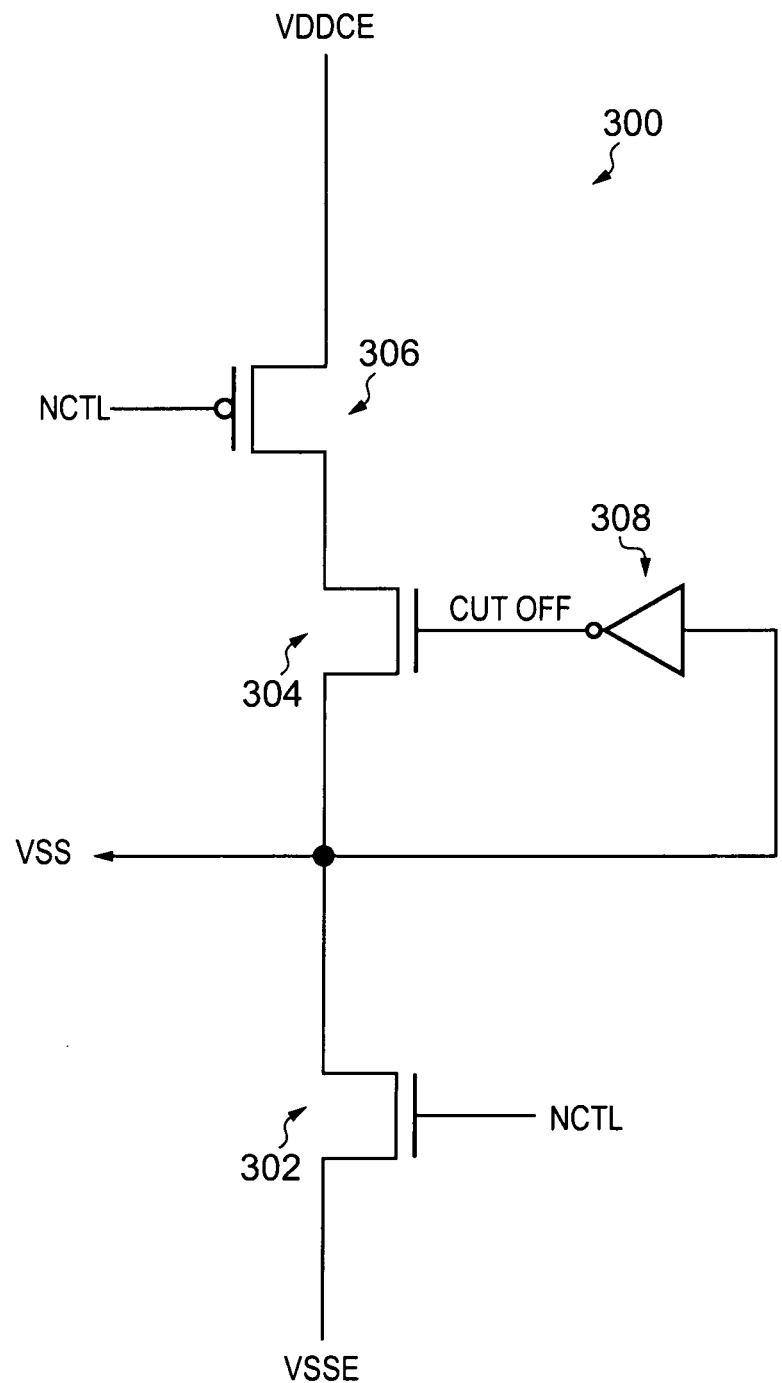
FIG. 6 schematically illustrates a voltage regulation circuit according to one embodiment.

Whilst the embodiments described above have been concerned with pulling-down an output voltage VDDC, before cutting-off the fall, the techniques of the present invention are equally applicable in a complementary embodiment in which a rising voltage signal is regulated, i.e. is prevented from rising too far. Such an example embodiment is schematically illustrated in FIG. 6 showing voltage regulation circuitry 300. Here, a pull-down n-type threshold device (NMOS 302) connects the reference voltage node VSSE to an output voltage node VSS. Output voltage node VSS is connected to supply voltage node VDDCE via a pull-up stack comprising a pull-up p-type threshold device (PMOS 306) and a pull-up n-type threshold device (NMOS 304). PMOS 306 and NMOS 302 are switched in dependence on control signal NCTL. Hence, in operation when NCTL is high (in a set up phase) output voltage node VSS is pulled down to VSSE. Then, in operation when NCTL is deasserted, NMOS 302 is switched off and PMOS 306 is switched on, causing output node VSS to be pulled-up towards VDDCE. The rising value at the output node VSS causes the cut-off signal CUTOFF to fall (as inverted by inverter 308) eventually switching off NMOS 304 and preventing a further rise in the voltage at output node VSS. Finally, when NCTL is asserted again, output node VSS is pulled back down to VSSE.

Various features of an embodiment of the present invention and of its context with respect to the prior art are described in the following appendix, with reference to FIGS. 7 and 8.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

APPENDIX

Circuit for automatic regulation of SRAM bitcell supply for write assist.

For SRAM cells in advanced process technologies, it is difficult to write a '0' at low voltage due to the low supply voltage and high NMOS pass gate threshold voltage. One solution is to lower the bitcell supply which makes the bitcell PMOS pull-up device weaker and easier to overcome. But the bitcell supply must not be allowed to fall too low; otherwise the bitcell contents may be corrupted. Also, the power consumption and cycle time will increase. This circuit pulls down the bitcell supply. Upon reaching a certain voltage level, the pull down is automatically stopped which preserves the retention margin, write margin and limits power and cycle time penalty.

One solution to regulate bitcell supply is to generate a self-timed pulse for the pull-down. This requires extra control circuitry which may be skewed with respect to the main self-timed path. It also requires a lot of margin to take care of pulse width variation and the variation in the rate of fall of the bitcell supply. It's difficult to have a single circuit which works across the whole range of process, temperature, pulse width and bitcell column size variation.

The disclosed circuit doesn't need a self-timed path because it senses the bitcell supply directly and adjusts the pull down pulse according to the bitcell supply level. The disclosed circuit functions to cut off the pull down based on the bitcell supply voltage level, rather than the rate of fall. Hence it can work for any column size. Further, the disclosed circuit feedback is done by a dynamic inverter which doesn't dissipate any static current. Also, using a PMOS device in the pull down stack makes the falling bitcell supply tail off once it reaches close to the PMOS threshold voltage. This improves the retention margin by making the final cutoff voltage less dependent on the speed of the feedback path. Using a PMOS device also allows a faster feedback from the bitcell supply by removing an inversion stage from the feedback path.

Figure 7:
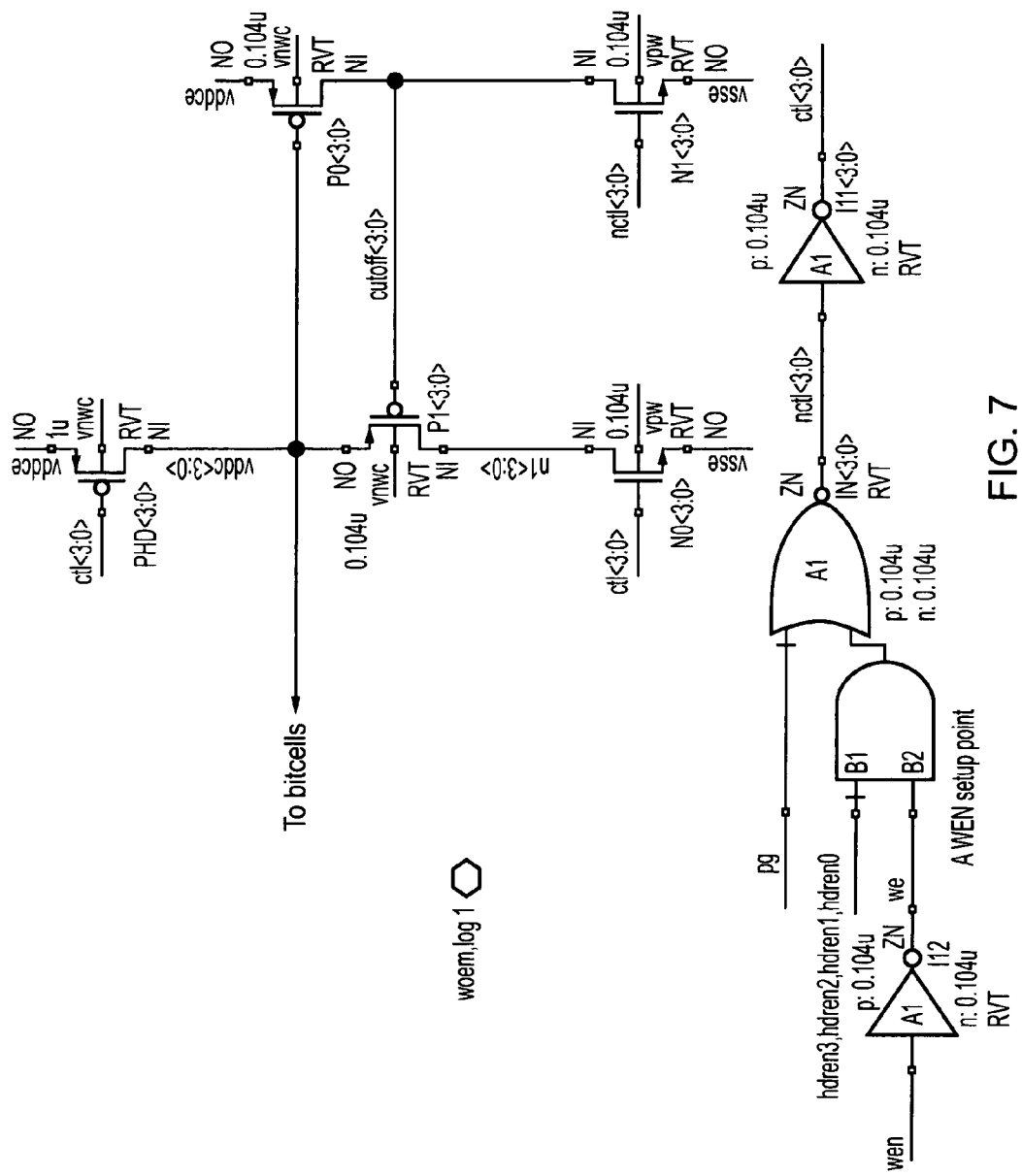
FIG. 7 schematically illustrates a voltage regulation circuit and associated control signal generation circuitry according to one embodiment.

A schematic of an embodiment of the invention is shown in FIG. 7 and further discussed in the following paragraphs.

One such circuit may be placed in each memory I/O column.

The HDREN signals are formed from the decoded column mux select signals and the write clock in the memory's central control block. The PG signal controls power-gating and the WEN signals controls the write-mask for this column. These are factored into the CTL/NCTL signals which start the pull down.

In normal operation PG=0. During the setup phase, HDREN0/1/2/3=0. So NCTL=1 and CTL=0. CUTOFF is discharged to 0 by N1. The bitcell supply VDDC is pulled up to VDDCE by PHD. N0 and P0 are off.

During a write cycle one of the HDREN signals goes high. N0 turns on. The pre-discharged node CUTOFF is released and floats. Since CUTOFF=0, P1 remains on. PHD turns off and VDDC starts discharging through P1 and N0. As VDDC falls, P0 begins to turn on and pull up CUTOFF. As CUTOFF rises, P1 starts turning off and the pull down slows down. Eventually, P1 turns off, VDDC is left floating and CUTOFF is pulled high.

Figure 8:
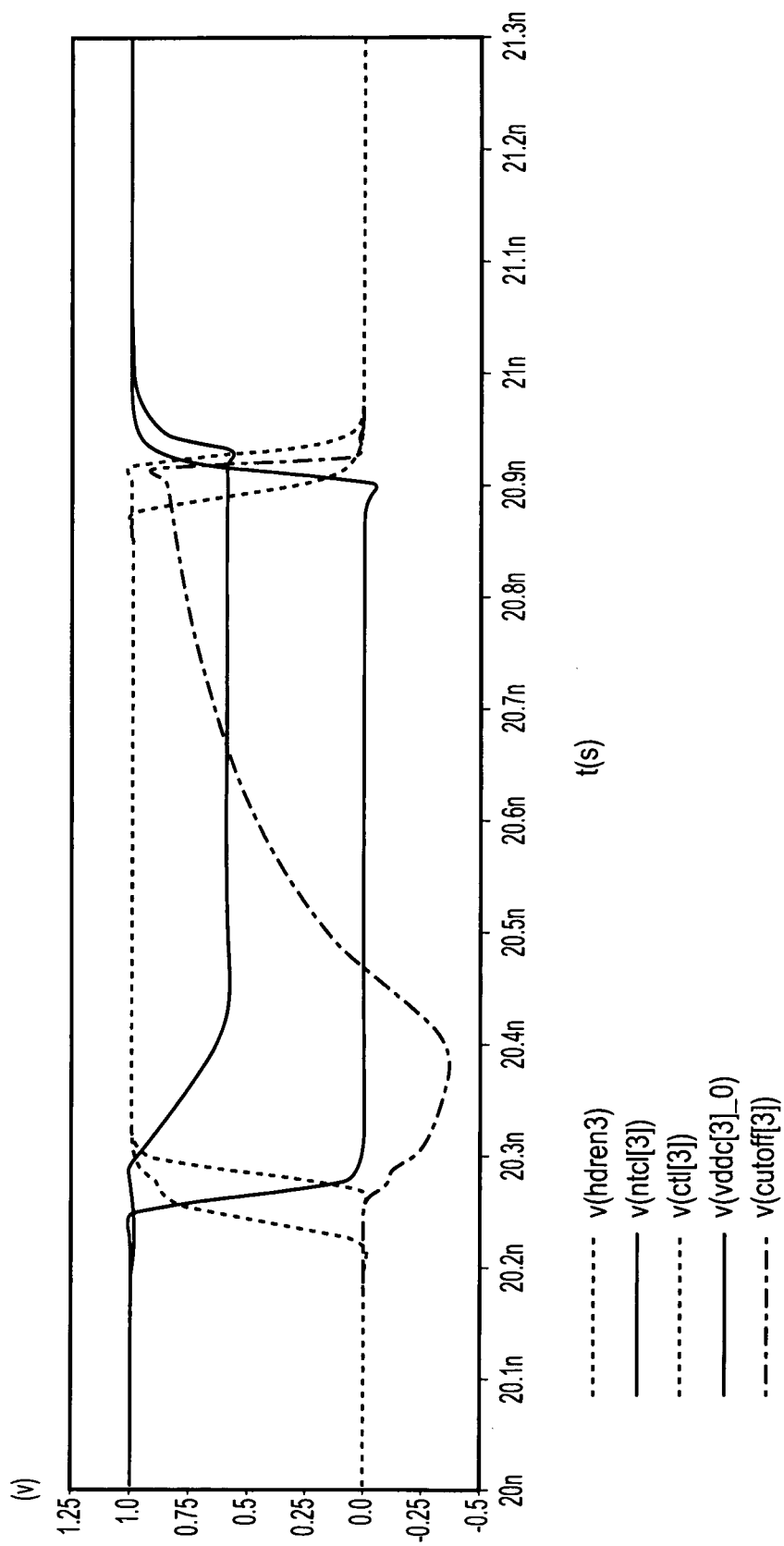
FIG. 8 schematically illustrates a simulation of various signals in the voltage regulation circuitry schematically illustrated in FIG. 7.

Waveforms shown in FIG. 8.

In this way the bitcell supply VDDC is pulled down and the pull down is automatically cut off after a certain level. The device P0 can be made low-VT for earlier cutoff.

Using the PG signal allows the bitcell supply to be pulled very low in power-gating mode. This reduces bitcell leakage.

The dynamic inverter (P0+N1) can be replaced by a static inverter if some static current is acceptable.

The circuit can be used anywhere a slowly falling signal has to be regulated. A complementary version can be used for slowly rising signals.

I claim:

1. Voltage regulation circuitry comprising:
a first threshold device connecting a first voltage node to an output voltage node, said first threshold device configured to be switched off in dependence on a control signal;
a stack connecting said output voltage node to a second voltage node, said stack comprising a second threshold device and a third threshold device connected in series; and
an inverter configured to receive an input from said output voltage node and configured to generate a cut-off signal,
wherein said second threshold device is configured to be switched on in dependence on said control signal and said third threshold device is configured to be switched off in dependence on said cut-off signal.

2. Voltage regulation circuitry as claimed in claim 1, wherein:
said first threshold device is a pull-up p-type threshold device and said first voltage node is a supply voltage node; and
said stack is a pull down stack and said second voltage node is a reference voltage node, said second threshold device is a pull-down p-type threshold device and said third threshold device is a pull-down n-type threshold device.

3. Voltage regulation circuitry as claimed in claim 2, wherein said inverter comprises a further p-type threshold device and a further n-type threshold device connected in series between said supply voltage node and said reference voltage node,
said further p-type threshold device connecting said supply voltage node to a cut-off node and said further n-type threshold device connecting said cut-off node to said reference voltage node,
wherein said further p-type threshold device is configured to be switched on when said input from said output voltage node is below a threshold voltage, said further n-type threshold device is configured to be switched on in dependence on an inverted version of said control signal, and said cut-off signal is provided at said cut-off node.

4. Voltage regulation circuitry as claimed in claim 2, wherein said output voltage node provides a bitcell supply voltage for at least one memory bitcell.

5. Voltage regulation circuitry as claimed in claim 4, wherein said control signal is configured to be asserted during a write procedure of said at least one memory bitcell.

6. Voltage regulation circuitry as claimed in claim 5, further comprising control signal generation circuitry configured to generate said control signal in dependence on write procedure control signals,
wherein said control signal generation circuitry is configured to assert said control signal in response to a power gating signal, regardless of said write procedure control signals.

7. Voltage regulation circuitry as claimed in claim 6, wherein said output voltage node provides said bitcell supply voltage for a plurality of memory bitcells and said write procedure control signals comprise multiplexer signals configured to select between said plurality of memory bitcells and write mask control signals.

8. Voltage regulation circuitry as claimed in claim 4, wherein said at least one memory bitcell is at least one SRAM memory bitcell.

9. Voltage regulation circuitry as claimed in claim 4, wherein said output voltage node provides a bitcell supply voltage for a column of memory bitcells.

10. Voltage regulation circuitry as claimed in claim 2, wherein a switching threshold of said inverter is configured such that, after said control signal is asserted, said cut-off signal causes said pull-down p-type threshold device to be switched off before said control signal is deasserted.

11. Voltage regulation circuitry as claimed in claim 3, wherein a switching threshold of said further p-type threshold device is configured such that, after said control signal is asserted, said cut-off signal causes said pull-down p-type threshold device to be switched off before said control signal is deasserted.

12. Voltage regulation circuitry as claimed in claim 2, wherein a switching threshold of said inverter is configured such that said cut-off signal causes said pull-down p-type threshold device to be switched off when a threshold voltage of said input from said output voltage node is reached.

13. Voltage regulation circuitry as claimed in claim 3, wherein a switching threshold of said further p-type threshold device is configured such that said cut-off signal causes said pull-down p-type threshold device to be switched off when said threshold voltage of said input from said output voltage node is reached.

14. Voltage regulation circuitry as claimed in claim 2, wherein said pull-up p-type threshold device and said pull-down p-type threshold device are PMOS threshold devices and said pull down n-type threshold device is an NMOS threshold device.

15. Voltage regulation circuitry as claimed in claim 3, wherein said further p-type threshold device is a PMOS threshold device and said further n-type threshold device is an NMOS threshold device.

16. Voltage regulation circuitry as claimed in claim 2, wherein said pull-up p-type threshold device is larger than said pull down n-type threshold device and said pull-down p-type threshold device.

17. A memory device comprising voltage regulation circuitry as claimed in claim 2.

18. Voltage regulation circuitry as claimed in claim 1, wherein:
said first threshold device is a pull-down n-type threshold device and said first voltage node is a reference voltage node; and
said stack is a pull-up stack and said second voltage node is a supply voltage node, said second threshold device is pull-up p-type threshold device and said third threshold device is a pull-up n-type threshold device.

19. Voltage regulation circuitry comprising:
pull-up p-type threshold means for connecting a supply voltage node to an output voltage node, said pull-up p-type threshold means configured to be switched off in dependence on a control signal;
pull-down stack means for connecting said output voltage node to a reference voltage node, said pull-down stack means comprising a pull down n-type threshold device and a pull-down p-type threshold device connected in series; and
inverting means for receiving an input from said output voltage node and generating a cut-off signal,
wherein said pull-down n-type threshold device is configured to be switched on in dependence on said control signal and said pull-down p-type threshold device is configured to be switched off in dependence on said cut-off signal.

* * * * *